United States Patent [19]

Frankeny et al.

[11] Patent Number: 6,094,059
[45] Date of Patent: Jul. 25, 2000

[54] APPARATUS AND METHOD FOR BURN-IN/TESTING OF INTEGRATED CIRCUIT DEVICES

[75] Inventors: Jerome A. Frankeny, Taylor, Tex.; Anthony P. Ingraham; James Steven Kamperman, both of Endicott, N.Y.; James Robert Wilcox, Vestal, N.Y.

[73] Assignee: International Business Machines Corporation, Armonk, N.Y.

[21] Appl. No.: 09/241,045

[22] Filed: Feb. 1, 1999

Related U.S. Application Data

[62] Division of application No. 08/789,926, Jan. 28, 1997, Pat. No. 5,949,246.

[51] Int. Cl.⁷ .................................................. G01R 31/02
[52] U.S. Cl. ..................... 324/757; 324/760; 324/158.1
[58] Field of Search ..................................... 324/757, 760, 324/765, 158.1

[56] References Cited

U.S. PATENT DOCUMENTS

| | | |
|---|---|---|
| 3,634,807 | 1/1972 | Grobe et al. . |
| 3,680,037 | 7/1972 | Nellis et al. . |
| 4,408,814 | 10/1983 | Takashi et al. . |
| 4,581,679 | 4/1986 | Smolley . |
| 5,163,834 | 11/1992 | Chapin et al. . |
| 5,187,020 | 2/1993 | Kwon et al. .......................... 324/757 X |
| 5,248,262 | 9/1993 | Busacco et al. . |
| 5,297,967 | 3/1994 | Baumberger et al. . |
| 5,313,097 | 5/1994 | Haj-Ali-Ahmadi et al. . |
| 5,313,157 | 5/1994 | Pasiecznik, Jr. . |
| 5,336,992 | 8/1994 | Saito et al. . |
| 5,420,520 | 5/1995 | Anschel et al. . |
| 5,534,784 | 7/1996 | Lum et al. ............................... 324/757 |
| 5,726,580 | 3/1998 | Wood et al. .............................. 324/758 |
| 5,764,071 | 6/1998 | Chan et al. ............................... 324/754 |
| 5,848,465 | 12/1998 | Hino et al. ........................... 324/757 X |
| 5,859,539 | 1/1999 | Wood et al. .............................. 324/758 |
| 5,880,590 | 3/1999 | Desai et al. .............................. 324/757 |
| 5,886,535 | 3/1999 | Budnaitis ................................ 324/760 |

FOREIGN PATENT DOCUMENTS

RD-309064  1/1990  WIPO .

OTHER PUBLICATIONS

"Soft Probe for Direct Chip Cell Burn–in," Pape, et al., IBM Technical Disclosure Bulletin, vol. 35, No. 1B, Jun., 1992.

*Primary Examiner*—Glenn W. Brown
*Attorney, Agent, or Firm*—William N. Hogg

[57] ABSTRACT

A technique for testing/stressing integrated circuit devices, especially wafers, having a plurality of contacts on one face thereof arranged in a predetermined pattern is provided. An interposer having a dielectric substrate and a device contact face and a tester contact face is provided. A first plurality of releasable connectors on the device contact are face arranged in the same predetermined pattern, and a second plurality of releasable connectors are arranged in the same predetermined pattern on the tester contact face. The releasable connections are formed of dendrites. Conducting vias connect the corresponding connectors of the first and second releasable connectors respectively. A test head is provided having a plurality of contact pads also arranged in the same predetermined pattern. Circuitry is provided on the test head to connect each of the contact pads thereon with external leads extending to provide signal contact to each of the contact pads on the test head. The interposer is positioned between the IC device and the test head, with the contacts on the IC device in contact with the first plurality of connectors and the contact pads on the test head in contact with the second plurality of connectors. Signals are provided to the connector pads from the electrical leads for performing testing and/or burn-in of the integrated circuit device. The testing is performed at elevational temperatures. A test head structure is also disclosed.

2 Claims, 2 Drawing Sheets

APPARATUS AND METHOD FOR BURN-IN/ TESTING OF INTEGRATED CIRCUIT DEVICES

RELATED APPLICATIONS

This application is a divisional of application Ser. No 08/789,926 filed on Jan. 28, 1997, now U.S. Pat. No. 5,949,246.

FIELD OF THE INVENTION

This invention relates generally to the burn-in and/or testing of integrated circuit devices, and more particularly to the burn-in and/or testing of integrated circuit devices in the form of wafers before they have been diced to form integrated circuit chips.

In the manufacture and testing of integrated circuit chips, a common technique is to form a wafer of semiconductive material such as silicon, and to form in and on the wafer the necessary circuitry for a multiplicity of integrated circuit chips. The wafer is formed with all of the circuitry necessary for the functioning of each of the chips, including I/O contacts for connecting to I/O signals, power and ground. The contacts may be for either wire bond connections or compressive bonding connections or for controlled collapse chip connect (C4) bonds which utilizes solder balls for flip chip bonding.

Whatever type of contact is to be made to the chip, it is necessary for the chip to be tested and a determination made as to whether the chip is good. This testing normally includes what is known as a "chip burn-in." During burn-in, the chips are heated to an elevated temperature above which they are rated to function, and stressed by the application of voltage and current, also often in excess of what the chip is rated to withstand. In the past, this burn-in has normally taken place on the individual chips after the wafer has been diced to form the individual chips, often after the chips have been packaged. Thus, in the past, it was necessary to form the chips, individually handle the chips and test the chips individually, and only then were bad chips detected. An example of testing such chips is shown in commonly assigned U.S. Pat. No. 5,420,520.

While this type of testing does work well, it requires a significant amount of processing of the wafer following the formation of the circuitry on and in the wafer before a determination is made that a chip is indeed bad. Moreover, the device of U.S. Pat. No. 5,420,520, has a direct connection between the tester head and the chip. When the tester head connection is worn, the entire head must be discarded, or at least significantly reworked.

It is therefore a principal object of the present invention to provide a technique for testing and stressing the circuitry on an integrated circuit device while at the wafer level and before the wafer has been diced to provide individual chips. It is a related object of this invention to provide a technique for testing integrated circuit devices at any level, wherein inexpensive contact is provided between the chip and the test device, which contact can be easily replaced as wear occurs.

SUMMARY OF THE INVENTION

According to the present invention, a technique for testing/stressing integrated circuit devices, and especially wafers, having a plurality of contacts on one face thereof arranged in a predetermined pattern is provided. The technique includes providing an interposer, with the interposer including a dielectric substrate having a device contact face and a tester contact face. A first plurality of releasable connectors is provided on the device contact face arranged in the same predetermined pattern, and a second plurality of releasable connectors is provided on the tester contact face, also arranged in the same predetermined pattern. Conducting vias connect the corresponding connectors of the first and second releasable connectors respectively. A test head is provided having a plurality of contact pads also arranged in the same predetermined pattern. Circuitry is provided on the test head to connect each of the contact pads thereon with external leads extending to provide signal contact to each of the contact pads on the test head. The interposer is positioned between the IC device and the test head, with the contacts on the IC device in contact with the first plurality of connectors and the contact pads on the test head in contact with the second plurality of connectors. Signals are provided to the connector pads from the electrical leads for performing testing and/or burn-in of the integrated circuit device,. The test head can be heated to provide the necessary heat for testing at elevated temperatures, although preferably the entire assembly of the test head, interposer and IC device is placed in an oven which is heated to a controlled temperature, at which point the electrical testing signals are provided from an external source. The oven itself may, in some instances, be provided with outlets to connect with the electrical leads, thus connecting the leads to the exterior of the oven for the reception of the electrical signals.

Preferably, the releasable connectors are formed of dendrites. Also, if the connection mode of the chips is to be through solder balls, these solder balls preferably are applied to the IC device prior to testing.

DESCRIPTION OF THE PREFERRED EMBODIMENT

Figure 1:
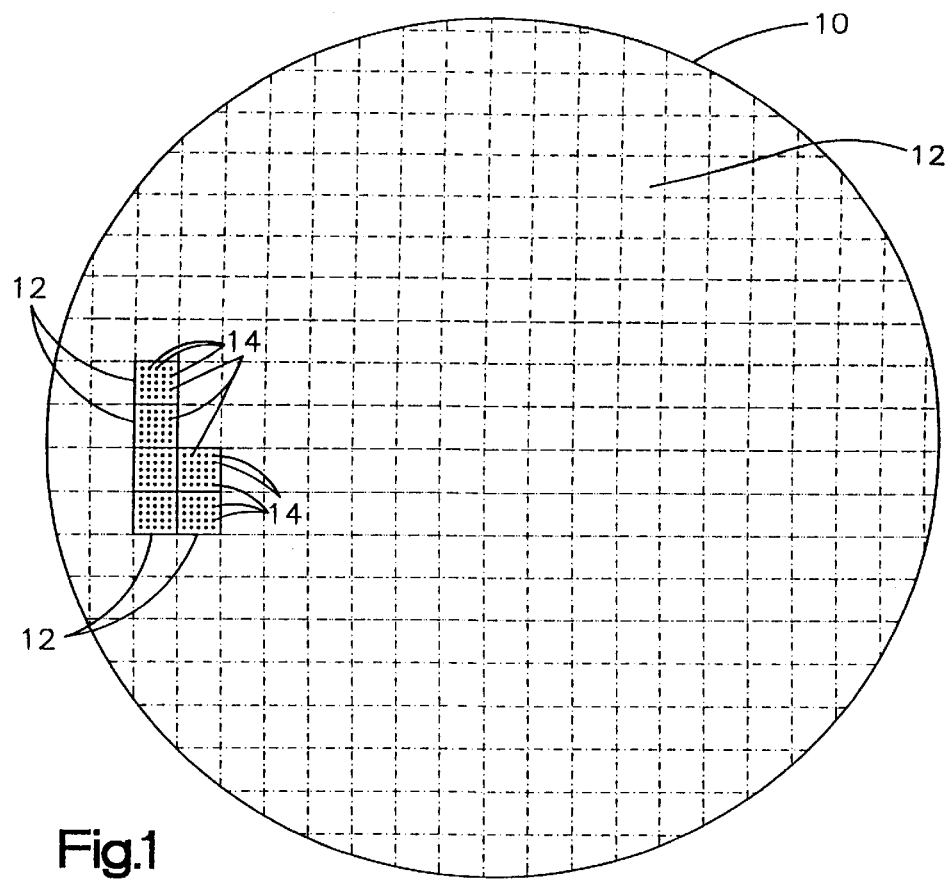
FIG. 1 is a plan view of a wafer after the circuitry has been formed thereon for integrated circuit devices, but before it has been diced to form individual chips.

Referring now to the drawings, and for the present to FIG. 1, a silicon wafer 10 which has been circuited to form IC devices is shown before the wafer 10 has been diced to form individual integrated circuit chips. The outline of where the dicing will take place to form the various chips 12 is shown in dotted lines. The circuitry includes a plurality of I/O pads 14, arranged in a predetermined pattern on one face 15 of the wafer 10. In this case, the overall pattern is comprised of the patterns and all of the chip pads. In the disclosed embodiment, the devices are being formed for C4 connection and, hence, solder bumps or solder balls 16 are formed on the I/O pads 14 (see FIG. 3). Signals must be conducted through the solder bumps 16 and I/O pads 14 to provide the burn-in function and testing function of the circuitry in the various chips 12 formed on the wafer 10.

Figure 2:
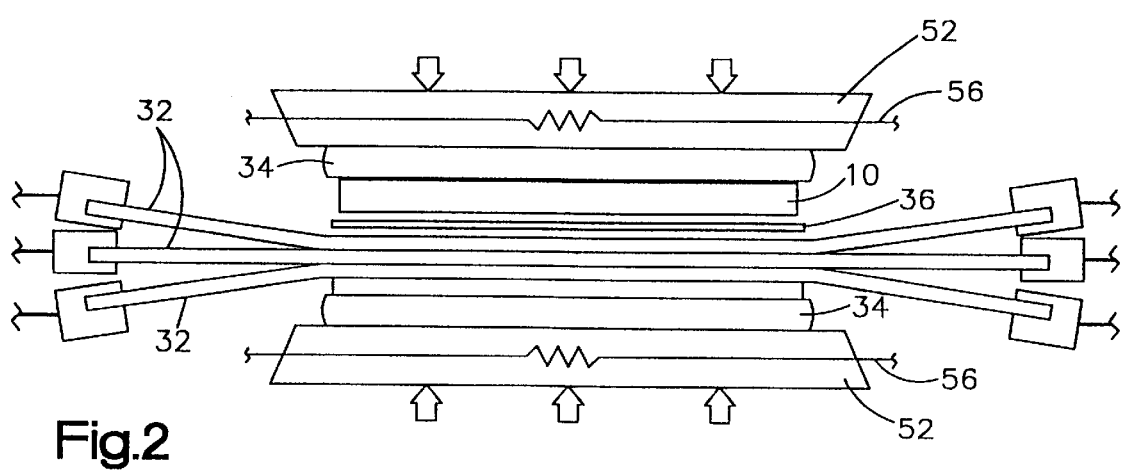
FIG. 2 is a side elevational view of a wafer, test head, interposer and platens in position for testing.
Figure 3:
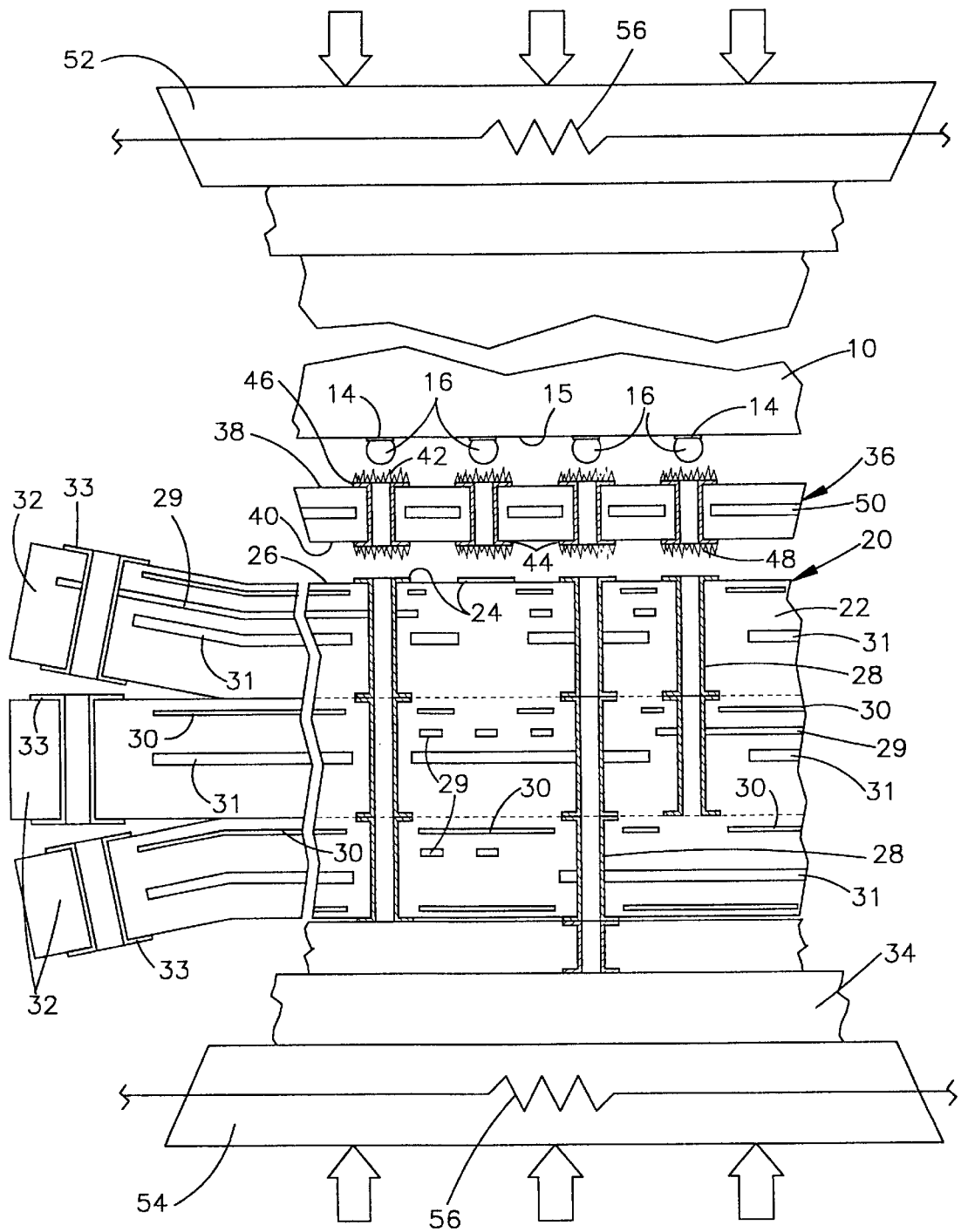
FIG. 3 is a longitudinal, sectional exploded view of a portion of a test head and interposer positioned for testing of a wafer according to this invention.

Referring now to FIGS. 2 and 3, to provide the test signals, a test head 20 is provided which has a substrate 22 having contact pads 24 formed on a contact pad face 26 thereof which are arranged in the same pattern as the I/O pads 14 on the wafer 10. Conducting plated through holes 28 extend internally into the substrate 22 and connect with internal wiring 29 to provide the electrical leads or signal planes necessary for supplying electrical signals to and reading electrical signals from the wafer 10. The testing head 20 also includes ground planes 30 and voltage planes 31, as well as the signal planes 29. In the preferred embodiment, the test head 20 is formed from a plurality of flexible circuits 32 which are laminated or otherwise joined at their central position to provide the connection to the wafer. The flexible cover circuits 32 are maintained separately at their apparent ends as shown in FIGS. 2 and 3 and are provided with electrical connections 33 which connect to the circuitry 29. Indeed, the circuitry 29 is a part of the flexible circuits 32. In one embodiment, a base plate 34 is laminated to the bottom mount flexible circuit 32 which can be used to provide the ground or power input.

An interposer 36 is provided which is formed of a dielectric material, as will be described presently, which has a device contact face 38 and a test head contact face 40. A set of connectors 42 is formed on the device contact face 38, and a set of connectors 44 is formed on the tester contact face 40. Conducting vias or through holes 46 extend from the connectors 42 to the connectors 44.

Each of the connectors in the sets of connectors 42 and 44 are formed with dendrites 48 on their surfaces to provide for releasable connection. The provision of dendrites to form releasable connections is well known in the art, as are the techniques for forming dendrites. Preferably, the dendrites are formed from palladium (Pd). The forming of dendritic connections is described in commonly assigned U.S. Pat. No. 5,137,461 to Bindra, et al., entitled "Separable Electrical Connection Technology." This patent describes separable and reconnectable electrical connections for electrical equipment in the form of dendrites characterized by elongated, cylindrical acicular morphology. The U.S. Pat. No. 5,137,461 also describes a technique for forming the dendrites.

In order to control the coefficient of thermal expansion (CTE) of the interposer 36, it is preferred that a low CTE core 50, which can be formed of either copper-invar-copper (CIC), molybdenum or invar, be provided for controlling of the CTE of the interposer as will be explained presently.

To perform a test and burn-in function, the interposer 36 is positioned between the wafer 10 and the test head 20, with the I/O pads 14 and contact pads 24, connectors 42 and 44 all in alignment, and pressure is asserted by a fixture including platens 52 and 54 as indicated by the arrows in FIGS. 2 and 3 to squeeze the wafer 10, interposer 36 and test head 20 together. The dendrites 48 on the connectors 42 engage and make electrical contact with the solder bumps 16, and the dendrites 48 on the connectors 44 engage and make contact with the contact pads 24 on test head 20 providing a good electrical path between the electrical leads of the flex cables 32 and the I/O pads 14 on the wafer 10. In the embodiment depicted, the platens 52 and 54 are conventional platens in a laminating press, and hence are heated as shown schematically by electric heating elements 56. The elements 56 are then heated in a controlled manner to heat the wafer to the desired test temperature which conventionally is between about 100° C. and about 190° C. The connectors 33 are attached to a computer controlled signal generator (not shown) to generate the test signals in a well known manner. The computer is programmed in a well-known manner to perform the tests and burn-in functions.

In another embodiment, heated platens are not used. Rather, any clamping device can be used to exert pressure on planes of the platens, and the assembly of the wafer 10, interposer 36 and test head 20, together with whatever device is clamping them together, is then put into a furnace and, if the furnace has internal leads, the leads from the flex cable 32 are inserted therein; otherwise the flex cable 32 extends from the furnace and is attached to whatever device such as a computer that is used to provide signals to the test head 20. Such connections and devices are well known in the art and need not be shown or described further. The assembly of the tester, interposer and wafer is then heated to the required temperature, which as indicated previously normally is in the range of about 100° C. to 190° C. and the necessary burn-in and test functions are performed at these conditions.

Because of the heating at elevated temperatures for testing, there is a significant amount of thermal expansion which takes place in the various elements of the structure being heated; and, as is well known, the larger the object being heated, the more expansion takes place at the outer edges thereof. Thus, while in the case of a chip, which is relatively small, thermal expansion may not be extremely significant; nevertheless, in the case of a wafer which is so much larger, thermal expansion can and does play a significant role. Thus, it is desired to design and construct the interposer 36 and tester to have CTE's which are close enough to that of the wafer 10 so as to not disrupt testing at these elevated temperatures.

The CTE of silicon is about 2.5 ppm/° C. Thus, the interposer should be constructed to have a relatively close CTE. To this end, the dielectric material of the interposer 36 can be either polytetrafluoroethylene (PTFE) or polyimide, with the core 50 being either copper-invar-copper, molybdenum or invar. If the core 50 is invar and the dielectric is either PTFE or polyimide, the composite CTE of the interposer will be around 3; and if the core 50 is made of CIC, the interposer 36 will have a CTE of about 6 ppm/° C. For many applications, silica filled PTFE is the preferred material.

With the tester 20 being formed as shown and described, the signal planes 29 can be either shielded or unshielded. With shielded planes, the CTE will be about 10 ppm/° C., and with unshielded planes, the CTE will be about 8.50 ppm/° C. In any event, whatever the choice is, the CTE's of all of these various elements should be reasonable close to the other so that, upon heating, contact is maintained at all connections. Preferably, the CTE of the interposer is between that of the wafer 10 and the test head 50.

Following the testing, either the platens are disengaged or the device is removed from the furnace, whichever the case may be; the assembly cooled down; the wafer 10 and interposer 34 are removed from the test head; and the wafer 10 is diced into chips saving those chips which are good and discarding those which have been determined to be bad during the testing.

One of the advantages of the present invention is the use of an interposer between the tester and the IC device being tested. The interposer is a relatively inexpensive device and if, as often happens, after multiple uses, the dendrites become worn or do not function as well as when they were new, it is relatively easy to discard the interposer and provide a new one. Whereas, if dendritic connectors were provided on the test head, when the dendrites lose their efficacy, it would be necessary to discard, or at least substantially rework, the entire test head. Thus, a significant cost savings can be realized. Moreover, the interposer can be customized to any particular wafer configuration, thus also resulting in a significant cost savings over having to fashion a test head specific to each configuration of wafer contacts.

Because of these features, it is also possible to use an interposer effectively in testing individual chips, even though the thermal expansion consideration is not as stringent.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. An interposer for use in testing/stressing IC chips in a tester, each of said chips having a plurality of contacts on one face thereof, said contacts being arranged in a predetermined pattern, said tester having contact pads arranged in said predetermined pattern, said interposer comprising:

a dielectric substrate, said substrate having a chip contacting face and a tester contacting face, a first set of raised releasable connectors on said chip contacting face arranged in said predetermined pattern, said first set of raised releasable connectors being configured to penetrate the contacts on said one face of said chip, a second set of raised releasable connectors on said tester contacting face arranged in said predetermined pattern, said second set of raised releasable connectors being configured to penetrate the contact pads on said tester, conducting vias connecting the corresponding connectors of said first and second sets of connectors, and said dielectric substrate including a member embedded in said dielectric substrate to control the coefficient of thermal expansion to about 6 ppm/° C. or less.

2. The interposer as defined in claim 1, wherein said raised releasable connectors include dendrites.

* * * * *